United States Patent [19]
Nicolici et al.

[11] Patent Number: 6,166,919
[45] Date of Patent: Dec. 26, 2000

[54] CASING MOUNTABLE FILLER MODULE

[75] Inventors: Radu-Marko Nicolici, Ottawa; Robert J. Barber, Carleton Place; John F. Weber, Ottawa, all of Canada

[73] Assignee: Notrel Networks Corporation, Montreal, Canada

[21] Appl. No.: 08/991,554

[22] Filed: Dec. 16, 1997

[51] Int. Cl.[7] .................................................. H05K 9/00
[52] U.S. Cl. .......................... 361/800; 361/753; 439/148; 174/35 R
[58] Field of Search ...................................... 361/684, 685, 361/690, 703, 720, 724–727, 728, 736, 752, 753, 759, 796–802, 816, 818; 174/35 R, 356 C, 51; 439/62, 59, 76.1, 607–610, 148

[56] References Cited

U.S. PATENT DOCUMENTS

| | | |
|---|---|---|
| 4,542,443 | 9/1985 | Rinefierd, Jr. . |
| 4,631,641 | 12/1986 | Brombal et al. . |
| 4,829,432 | 5/1989 | Hershberger et al. . |
| 4,872,212 | 10/1989 | Roos et al. . |
| 4,953,058 | 8/1990 | Harris ....................................... 361/690 |
| 4,960,391 | 10/1990 | Beinhaur et al. ........................ 439/559 |
| 4,970,625 | 11/1990 | Belanger et al. . |
| 5,023,754 | 6/1991 | Aug et al. . |
| 5,125,854 | 6/1992 | Bassler et al. ........................... 439/607 |
| 5,309,315 | 5/1994 | Naedel et al. . |
| 5,359,492 | 10/1994 | Porter ....................................... 361/683 |
| 5,388,995 | 2/1995 | Rudy, Jr. et al. . |
| 5,430,618 | 7/1995 | Huang ...................................... 361/818 |
| 5,539,620 | 7/1996 | Gale et al. . |
| 5,725,387 | 3/1998 | O'Sullivan et al. ....................... 439/98 |

*Primary Examiner*—Jayprakash N. Gandhi

[57] ABSTRACT

A filler module is slidably mountable in an otherwise unused slot of a multi-slot, multi-module electronic system housed in a casing. The filler module includes a relatively compact housing which engages an EMI gasket and an electric connector in an unused slot at the backplane of a shelf in the casing. The module also includes a non-conductive, rigid extension element which facilitates air flow between adjacent modules within the rack. The extension element may include electrically conductive strips which provide ESD protection during the insertion of the module through intimate contact with a grounded, resilient contacting surface. The module may also comprise a non-conductive bulkhead with pivoted latches which engage the casing to secure the housing to the backplane. In this way, a filler module is achieved in which EMI containment is accomplished in a modular fashion and air flow is maintained in the shelf independent of the number or position of used and unused slots. Modular EMI containment is particularly well suited for use in high speed (e.g., 2.5 to 10 GHz) electronic systems such as synchronous optical network transport nodes.

30 Claims, 5 Drawing Sheets

CASING MOUNTABLE FILLER MODULE

FIELD OF THE INVENTION

The present invention relates to electronic enclosures, and more particularly to a filler module mountable in an otherwise unused slot of a multi-slot, multi-module electronic system.

BACKGROUND OF THE INVENTION

Existing electronic systems, such as for example telephone switches or processing equipment, are often assembled from numerous functional electronic modules slidably mounted in a casing, typically comprising at least one shelf that mounts in a bay. Such casings must typically be shielded to limit electromagnetic emissions from the modules and the connectors to the modules. Numerous shielded shelving assemblies, such as those disclosed in U.S. Pat. Nos. 4,631,641 and 5,539,620, are known.

The shelving assembly disclosed in U.S. Pat. No. 4,631,641, for example encloses an entire shelf of electronic modules between top, bottom, side and rear walls. The numerous adjacent front faceplates of the modules complete the enclosure. Top and bottom walls are meshed and allow for airflow across the modules, while still shielding electronic emission. However, for electronic modules working at higher frequencies, openings in any enclosure may permit the emission of electromagnetic interference ("EMI").

U.S. Pat. No. 5,539,620 discloses individually shielded modules each encapsulating a plurality of circuit boards, and mountable within a shelf.

Existing high speed synchronous optical network transport nodes are made up of many high speed electronic functional modules having electronic components operating at frequencies between 2.5 and 10 GHz. Each module contains at least one printed circuit board (PCB). Each PCB is individually housed in a sealed enclosure thereby forming an EMI contained module. An electrically conductive bulkhead extends from the front of each module, and provides a front EMI shield for the module, while permitting securement of the module in the shelf. Heat is transferred from the enclosed PCB through the enclosure. The remainder of the enclosure is made of a thermally conducting material such as aluminum, and has a number of cooling fins. These fins facilitate heat transfer and direct air flow provided by a forced air cooling system between adjacent enclosures mounted within a shelf. Each PCB has a connector extending from an end of its enclosure. The connector is suited to engage a mating connector on the backplane of the shelf. To provide an EMI seal, the PCB enclosure also engages an electrically conductive gasket surrounding the connector on the backplane. The gasket provides EMI containment at the backplane.

Such opto-electronic systems are typically provided in many different configurations often without a full complement of functional transport cards. A typical shelf has ten mounting slots. Depending upon the configuration, between two and eight slots can be left unused. Leaving these unused slots empty, creates a number of problems. Specifically, unused connectors at the backplane will emit EMI; and airflow within the rack will be disrupted by an empty slot. Moreover, some system designs require some basic electronic terminating connections to the backplane.

These problems are presently addressed by providing a full sized, functional transport module as a filler module. Often the electronics carried by the PCB of a filler module are simplified to provide only the minimum required functionality. This, however, is quite costly as a full sized EMI housing is made almost entirely of cast aluminum.

The present invention attempts to address some of the shortcomings of existing filler modules.

SUMMARY OF THE INVENTION

It is an object of the present invention, to provide a filler module that shields EMI. It is a further object to provide such a module at a reduced cost.

As a feature of the present invention, the invention directs air flow about adjacent modules.

In accordance with an aspect of the present invention, there is provided a module mountable in a slot. The module comprises a conductive housing having a mating face, and an opening extending from the mating face into an interior of the housing. The opening is for receiving an electric connector into the housing. The mating face is adapted to engage an electromagnetic seal about the connector, to electromagnetically seal the connector in the housing. The module further comprises an extension element, made of non-conductive material rigidly extending from the housing and a conductor strip extends along at least one of the top and bottom face of the extension element.

In accordance with another aspect of the present invention, there is provided a module mountable in a slot of a casing for a plurality of electronic modules. The module comprises means to slidably guide the module into the slot; means to encapsulate an electric connector within the slot to prevent electromagnetic emission from the connector; and an extension element formed of a non-conductor material, rigidly extending from the means to encapsulate; and means to discharge static electricity from the extension element as the module is slid into the slot.

In accordance with a further aspect of the present invention, there is provided a module mountable in a slot, comprising a housing having a mating face, and an opening extending from the mating face into an interior of the housing. The opening may receive an electric connector into the housing. An extension element, made of non-conductive material rigidly extends from the housing and a conductive element extends from the extension element to discharge static electricity from the extension element as the module is slid into the slot.

In accordance with yet a further aspect of the present invention, there is provided in combination, a casing for mounting at least one electric module, the casing comprising a backplane, an electric connector extending from the backplane; and a module comprising a shielded housing having an opening extending from a mating surface, mounted about the electric connector to receive the electric connector in the opening. The module further comprises a non-conductive extension element, extending from the housing away from the backplane; a conductive element extending from the extension element arranged to discharge static electricity from the extension element as the module is slid into the casing; and a mounting assembly for securing the module to the casing; and a gasket for shielding an electromagnetic signals about the connector and between the backplane and the mating surface.

As a further feature of the invention, the invention provides a terminating circuit that electronically engages an electric connecter at the back plane of the housing. The terminating circuit indicates the presence of a filler card to the system assembled in the casing.

BRIEF DESCRIPTION OF THE DRAWING

In figures which illustrate, by way of example, embodiments of the present invention.

DETAILED DESCRIPTION

Figure 1:
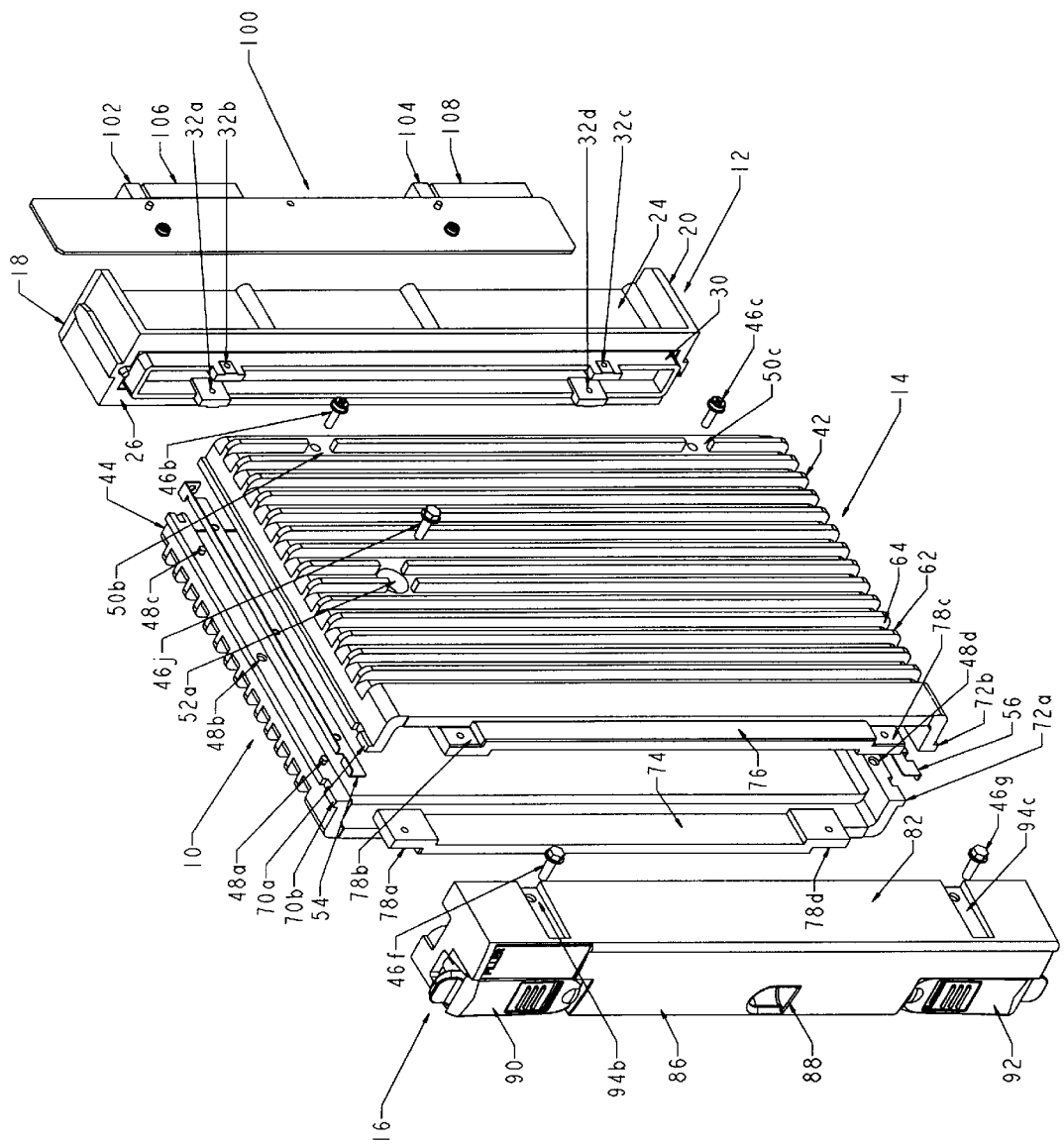
FIG. 1 is an exploded view of a filler module.
Figure 2:
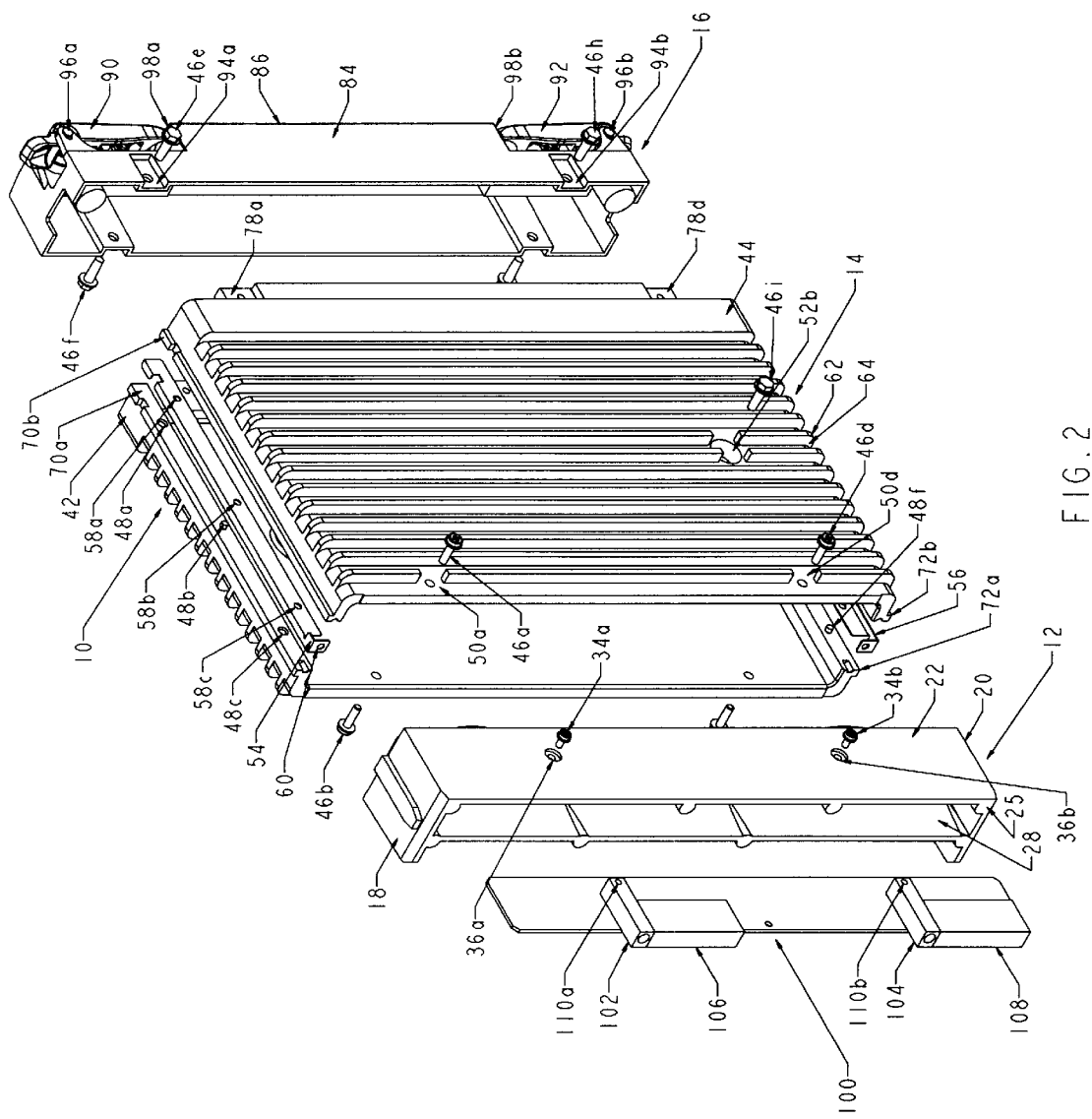
FIG. 2 is a further exploded view of the filler module of FIG.1.

FIGS. 1 and 2 illustrates a filler module 10, exemplary of a preferred embodiment of the present invention. Filler module 10 comprises an EMI cap 12; a non-conductive extension element 14; and a bulkhead 16. Housed within EMI cap 12 is an electronic printed circuit board ("PCB") 100.

EMI cap 12 is made of cast aluminum and has opposed top and bottom walls 18 and 20; opposed side walls 22 and 24; and a rear wall 26 all of which form a conductive housing. Edges of walls 20, 22 and 24 form a front mating face 25 of the housing. An opening 28 extends from the front of EMI cap 12 into the hollow interior of the housing defined by the five walls 18, 20, 22, 24 and 26. Extending outwardly from rear wall 26 is generally rectangular flange connecter 30, having tapped bosses 32a, 32b, 32c, and 32d.

EMI cap 12 surrounds PCB 100. PCB 100 is a mounting substrate for a plurality of electronic components (not shown). Also mounted to PCB 100 are guide sockets 102 and 104, as well as backplane socket connectors 106 and 108. Each of backplane socket connectors 106 and 108 has one-hundred and ten female electric connector slots that extend inwardly. PCB 100 is mounted to EMI cap 12 by screws 34a and 34b (best illustrated in FIG. 2), that extend through holes 36a and 36b of side wall 22 and holes 110a and 110b of guide sockets 102 and 104. The screws 34a and 34b rest within recesses about holes 36a and 36b of side wall 22.

A non-conductive extension element 14 extends lengthwise from flange 30 of EMI cap 12. Extension element 14 is generally rectangular, having a length, height and width. Extension element 14 is formed of two body halves 42 and 44, preferably made of a non-electrically conductive material such as polycarbonate structural foam. The two body halves 42 and 44 define a hollow interior. The body halves 42 and 44 are individually formed by injection molding. The two body halves 42 and 44 are held together by screws 46i and 46j through holes 52a and 52b. Alignment boss/hole pairs 48a–48f (48e, not shown) aid in keeping halves 42 and 44 aligned relative to each other. Screws 46a–46d rest in notches 50a–50d and further engage holes in tapped bosses 32a, 32b, 32c and 32d, thereby affixing EMI cap 12 to extension element 14.

Extending from the tops and bottoms of body halves 42 and 44 are ridge halves 70a, 70b and 72a, 72b. Assembled, these form top and bottom mounting ridges. Additionally, metallic strips 54 and 56 extend along the length of the top and bottom ridges. Each of strips 54 and 56 has a horizontally and vertically extending portion, together forming a substantially L-shaped cross section. The horizontally extending portion of each strip 54 and 56 rests on the top and bottom mounting ridges, while the vertically extending portions extend between ridge halves 70a and 70b or 72a and 72b. Vertically extending portion of strip 54 further has holes 58a–58c, complementary to alignment boss/hole pairs 48a–48f, allowing each alignment boss to extend through the strip. Additionally, a downwardly protruding end portion 60 of strip 54 is lodged between EMI cap 12 and extension element 14, electrically connecting EMI cap 12 to strip 54. Strip 56 is similarly arranged with holes and an upwardly extending end portion connecting to EMI cap 12.

Further, a plurality of evenly spaced, parallel fins 62 extend outwardly from the side faces of body halves 42 and 44. The fins 62, extend along the height of extension element 14 from the top to the bottom edge of body halves 42 and 44. Two adjacent fins 62 form a vertical air flow channel 64 between the fins 62.

Extending near the front of body halves 42 and 44 are non-conductive flanges 74 and 76. At the tops and bottoms of flanges 74 and 76 are tapped bosses 78a–78d.

Bulkhead 16 is suited to secure filler module 10 in a bay, as more particularly described below. Bulkhead 16 is made of molded Ultem 1000™ and comprises side walls 82 and 84, extending in parallel from front wall 86. A cut-away portion 88 forms a finger handle in front wall 86 for inserting and removing module 10. Further cut-away portion 88 provides the appearance of a finger handle similar to a finger handle provided by a fully functional module (not shown) Latches 90 and 92 are pivotally mounted about pivot pins 96a and 96b in cut away portions 98a and 98b of front wall 86. Pivot pins 96a and 96b are held in place by circular clips (not shown). Preferably, latches 90 and 92 are spring loaded and exert additional forward pressure on module 10 when mounted. Screws 46e–46h extend through holes side walls 82 and 84, to engage tapped bosses 78a–78d and thereby affix bulkhead 16 to extension element 14 at an end opposite EMI cap 12. Screw pairs 46e–46h are ultimately seated within grooves 94a–94d of side walls 82 and 84.

It is worth noting that the majority of the volume of filler module 10 is formed by extension element 14. In fact, EMI cap 12 extends along only between ten and twenty percent of the length of the filler module 10. Specifically, module 10 is approximately 12.16 inches long and 12.12 inches high. EMI cap 12 is only 1.58 inches long while bulkhead 16 is only 1.8 inches long. Extension element 14 extends approximately 7.2 inches along the length of module 10. As extension element 14 is formed primarily of a foam or like material, the overall weight and production cost of a filler element is significantly less than a solid metal casing used to encapsulate an electronic card in a fully functional module.

Figure 3:
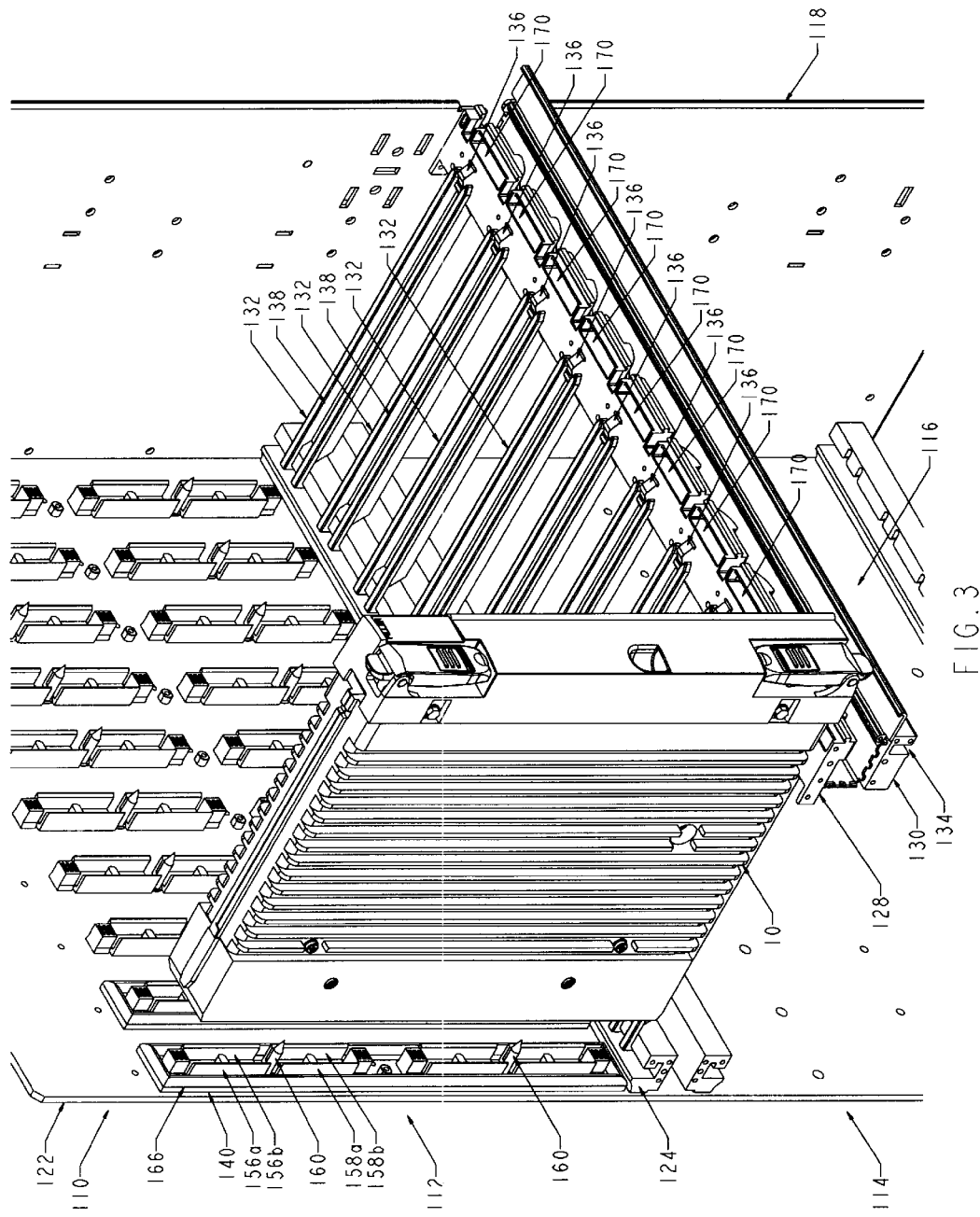
FIG. 3 is a left perspective view of the filler module of FIG. 1 installed in a slot.
Figure 4:
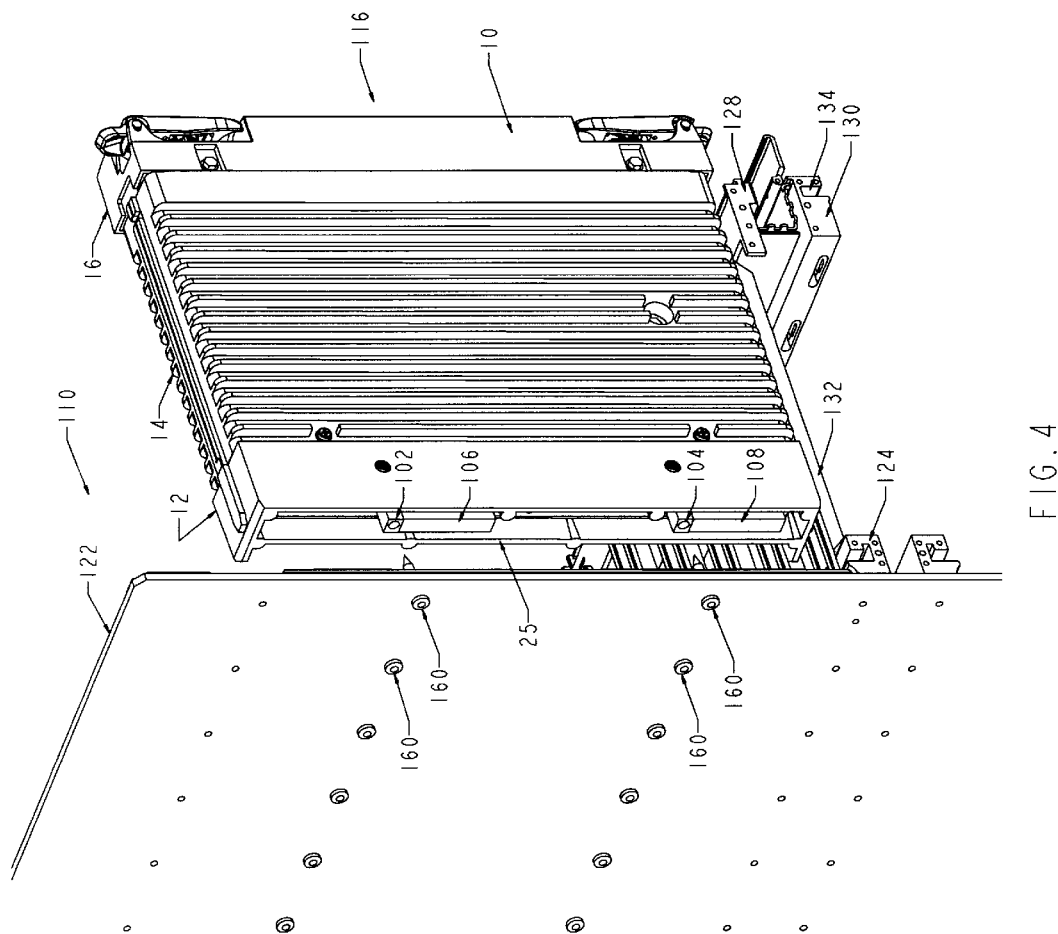
FIG. 4 is a further perspective view of the filler module of FIG. 1 installed in a slot.

As illustrated in FIGS. 3 and 4, filler module 10 is mountable in an enclosure bay 110, that is suitable for mounting a plurality of modules. The enclosure bay 110 is a typical bay in a telecommunications system, such as an optical transport node. Bay 110 comprises at least two shelves 112 and 114 mounted vertically, one above the other. Each shelf 112 and 114 is for mounting adjacent modules that, together, form the opto-electronic system forming an optical transport node. Bay 110 comprises sidewall 118, an opposed sidewall (not shown) and backplane 122. Shelf 112 is formed by rear bottom cross member 124 extending between side walls and mounted to back plane 122; front bottom cross member 128 also extending between the shelf sidewalls; and a plurality of bottom guide rails 132 uniformly spaced and extending in parallel between bottom front and rear cross members 124 and 128. Metallic leaf springs 136 extend upwardly from front bottom cross member 128 and are centered on each guide rail 132.

A further top front and rear cross members, and guide rails extending between these top cross members (not illustrated), also extend above module 10. These top guide rails define grooves similar to grooves 138. Metallic leaf springs extend downwardly from these top guides. A substantially similar top rear cross member 126 and top front cross member 130, forming part of shelf 114 beneath shelf 112, are illustrated. Top front cross member 130 defines a track 134, extending between bay sidewalls.

Front and rear top and bottom cross members 124, 126, 128 and 130 are made of cast aluminum. Bay sidewalls are made of a conductive material such as sheet metal. Bottom guide rails 132 are made of non-conductive plastic. Top guide rails (not shown) are also made of plastic. Bottom guide rails 132 each define a bottom groove 138 that receives a ridge of extension element 14 of filler module 10. The top guide rails (not shown) define similar grooves that receive the top ridge of module 10. Together, each top and bottom guide rails 132 and backplane 122 define a slot, marked generally 116.

Forming part of bottom cross bar 128 (FIG. 3) are a plurality of equally spaced sockets 170. These sockets 170 are adapted to receive a tip of a pivoting latch, as for example latch 92 of filler module 10. Track 132 of top front cross bar 130 is similarly adapted to receive the tip of a top pivoting latch, as for example latch 90 of filler module 10.

Figure 5:
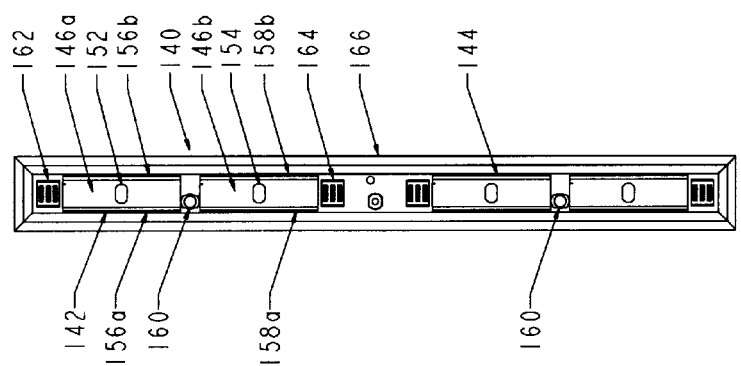
FIG. 5 is a front plan view of a backplane connector assembly mounted within the slot of FIG. 4.

Mounted on backplane 122 are a plurality of backplane connector assemblies 140, more particularly illustrated in FIG. 5. One connector assembly 140 is mounted within each slot in shelf 112. Connector assemblies 140 consist of top and bottom connector plugs 142 and 144. Connector plugs 142 and 144 are identical. More specifically, connector plug 142 consists of two standard Z-pack male AMP™ pin connectors 146a and 146b available through AMP of Canada Ltd., of Ottawa, Ontario, Canada, K7C 1T4. Each of AMP™ pin connector 146a and 146b sockets comprise two groups of outwardly extending pins. Groups of extending pins are separated by connecting spacers 152 and 154. Pin connectors 146a and 146b are guarded on each side by vertically and outward extending guides 156a, 156b and 158a, 158b. Guide pins 160 extend outwardly from the backplane in the center of connector plugs 142 and 144. Additionally, a top and bottom power connector 162 and 164 extend outwardly from back plane 122, above and below connector plug 142. Identical power connectors extend above and below connector plug 144. As well, surrounding the entire backplane connector assembly is an EMI gasket 166. EMI gasket 166 is a conventional EMI gasket made of an elastomeric conductive rubber, filled with nickel and carbon particulate, as for example manufactured by Parker Hannifin Corp. of Glen Williams, Ontario, Canada, L7G 3S2. The EMI gasket has a hollow D-shaped cross-section, which is compressed by an abutting functional or filler card.

Connector assemblies 140 allow for electrical interconnection of active electronic modules mounted in slots within grooves 138 of shelf 112. Each of the pins of each connector plug 142, 144 brings a signal carried by a single line of the backplane bus of backplane 122 to an active module. The active module typically comprises a self contained opto-electronic circuit, that was for example to act as an optical transmitter, receiver, regenerator, demultiplexors or the like. A plurality of such cards are assembled within a shelf or a bay to form a fully functional optical transport node. As will be appreciated, however, it may be possible to form a fully functional transport node without using all available slots forming part of a shelf.

In operation, a backplane bus of bay 110 carries high speed switching digital signals between connector assemblies 140 and any modules connected thereto. All slots of bay 110, are not occupied by functional electric modules. As such, absent appropriate shielding, electromagnetic signals will emanate from any connector not interconnected with a shielded card. This is clearly undesirable. Moreover, each functional module, (not shown) is mounted in close proximity to an adjacent module. Air flow is created by a fan (also not shown) mounted at the bottom of bay 110, forcing air upwards. Each functional module has a ribbed housing, made almost entirely of a heat conducting material such as aluminum and having outwardly extending fins virtually identical to fins 62 of module 10. Fins of adjacent modules align when modules are properly inserted in bay 110. Adjacent grooves on adjacent functional modules allow for laminar air flow between modules, thereby facilitating heat transfer from the modules. If any slot is empty, a disproportionate amount of air is directed through such a slot. As well, the air is dispersed in such an empty slot, and disrupts laminar flow from bottom to top shelves.

In order to limit emission of EMI and balance airflow, a functional filler module 10 is inserted in any unused slot, and specifically in slot 116. The functional filler module 10, is inserted in the shelf with the power off. A bottom guide ridge of module 10 is inserted into an empty groove 138 of rail 132. Metallic strip 54 mounted on the bottom ridge of module 10 makes electrical contact with leaf spring 136, which is grounded, until EMI cap 12 properly engages to make contact with seal 166. Metallic strip 56 similarly makes contact with a top leaf spring (not shown). Module 10 is slid along the groove 138 and into abutment with connector assembly 140 until connectors 102 and 104 (FIGS. 1 and 2) engage pins 160 of connector assembly 140. A moderate insertion force is applied and connector 106 and 108 engage connector plugs 142 and 144. Contact of leaf spring with metallic strips 54 and 56 prevents any build-up of electrostatic charge on housing 14 or top and bottom guide rail 132 (and later electrostatic discharge ("ESD")) as non-conductive housing 14 is slid along non-conductive rail 132. In this way, filler module 10 and backplane 122 are protected against ESD.

Once completely inserted, the mating face 25 of EMI cap 12 abuts and compresses EMI gasket 166. As well, all electric connectors within slot 116 are received within the hollow interior of EMI cap 12. Thus, backplane 122, EMI gasket 166, and EMI cap 12 completely encapsulate electric connectors within slot 116 and thereby contain EMI emissions present at these connectors. Additionally, as complementary connectors 106 and 108 on PCB 100 mechanically and electrically engage connector pins on connector assembly 140, the filler module 10 is securely received in the slot 116. Finally, bulkhead 16 and more particularly pivoting bottom latch 92 engages and locks into socket 170 thereby securing module 10 in shelf 112. Similarly top latch 90 engages a track of a front cross bar (not shown) similar to track 134. As will be appreciated, top and bottom latches 90 and 92 urge mating fare 25 into tight engagement with seal 166.

With the filler module in place, connector assembly 140 and PCB 100 are shielded. Moreover, fins 62 align with fins of an adjacent module, which may perhaps be a fully functional module, to form cooling channels and facilitate laminar air flow between modules.

As well, PCB 100 may carry several electronic components forming a termination circuit. This termination circuit is electrically connected to appropriate pins on connector assembly 140. The termination circuit is used by the system formed by shelves 112 and 114 to assess that a slot occupied by filler card 116 is occupied by a non-functional card. The termination circuit may simply comprise a plurality of terminating resistors that interconnect appropriate pins of connector assembly 140.

It will be understood that numerous modifications to the above described embodiments are possible. For example, bulkhead 16 could be eliminated entirely if module 10 could otherwise be secured within mounting slot 116. This might be accomplished by the engagement of connector assembly 140 or by otherwise engaging rail 132. EMI cap 12 need not be formed of cast aluminum; another conductive material could be used. For example, EMI cap 12 could be formed of a Zinc or magnesium alloy. Similarly extension element 14 need not be formed of polycarbonate structural foam, but could be formed of another material, that is preferably not an electric conductor other. Other polymers would, for example, be suitable. Similarly extension element 14 may be integrally formed. Similarly, the relative lengths of EMI cap 12 and housing 40 could be varied. Fins 60 may not be necessary depending on the shape of other modules within a shelf. Of course, filler module 10 could be used in a large variety of housing, that are not house optical transport nodes.

It will be further understood that the invention is not limited to the embodiments described herein which are merely illustrative of a preferred embodiment of carrying out the invention, and which are susceptible to modification of form, arrangement of parts, steps, details and order of operation. The invention, rather, is intended to encompass all such modifications within its spirit and scope, as defined by the claims.

We claim:

1. A module mountable in a casing, said module comprising
    a conductive housing having a mating face, and an opening extending from said mating face into an interior of said housing, said opening for receiving an electric connector on said casing into said housing, said mating face and said housing adapted to engage an electromagnetic seal about said connector, to electromagnetically seal said connector in said housing;
    an extension element, made of non-conductive material rigidly extending from said housing; and
    a conductive strip extending along at least one of a top and bottom face of said extension element.

2. The module of claim 1, further comprising a mounting assembly for securing said module within a slot of said casing.

3. The module of claim 2, wherein said mounting assembly comprises a bulkhead extending from said extension element.

4. The module of claim 2, further comprising a complementary connector fixed within said housing and adapted to engage said electric connector.

5. The module of claim 3, wherein said module has a length from end to end, and said bulkhead, said extension element, and said housing extend between said ends.

6. The module of claim 3, wherein said bulkhead is formed of an electrically non-conductive material.

7. The module of claim 3, wherein said housing is formed of one of cast aluminum, zinc alloy and magnesium alloy.

8. The module of claim 7, wherein said extension element is formed of a polymer.

9. The module of claim 8, wherein said polymer comprises poly-carbonate foam.

10. The module of claim 4, further comprising a printed circuit board supporting said complementary connector.

11. The module of claim 10, wherein said printed circuit board further comprises an electronic terminating circuit in communication with said complementary connector and adapted to electrically engage said electric connector.

12. The module of claim 1, having a length from one end to another opposite end, wherein said conductive housing extends from said one end toward said opposite end, along less than half said length of said module.

13. The module of claim 1, wherein said extension element further comprises a plurality of parallel fins, extending outwardly from opposed faces of said extension element.

14. The module of claim 13, wherein said fins extend along a height of said module.

15. The module of claim 1, wherein said extension element comprises an outwardly protruding, lengthwise extending mounting ridge extending beneath said conductive strip.

16. The module of claim 15, wherein said conductive strip is electrically interconnected to said conductive housing.

17. A module mountable in a slot of a casing for a plurality of electronic modules, said module comprising
    means to slidably guide said module into said slot;
    means to encapsulate an electric connector within said slot to prevent electromagnetic emission from said connector;
    means to secure said module in said casing;
    an extension element formed of non-conductive material, rigidly extending from said means to encapsulate,
    means to discharge static electricity from said extension element as said module is slid into said slot.

18. The module of claim 17, further comprising means to engage said electric connector.

19. A module mountable in a slot, said module comprising:
    a housing having a mating face, and an opening extending from said mating face into an interior of said housing, said opening for receiving an electric connector into said housing;
    an extension element, made of non-conductive material rigidly extending from said housing;
    a conductive element, extending from said extension element, to discharge static electricity from said extension element as said module is slid into said slot.

20. The module of claim 19, wherein said extension element comprises a plurality of parallel fins extending from opposing surfaces of said extension element and adapted to guide air along said surfaces.

21. The module of claim 20, wherein said extension element is formed of injection molded foam.

22. The module of claim 21, wherein said housing is formed of a conductive material.

23. The module of claim 22, wherein said extension element has a length less than half a length of said module.

24. The module of claim 23, further comprising mounting ridges for engaging said slot, said ridges extending from a top and bottom of said extension element.

25. In combination,
    a casing for mounting at least one electric module, said casing comprising a backplane;
    an electric connector extending from said backplane;
    a module comprising
        a shielded housing having an opening extending from a mating surface, mounted about said electric connector to receive said electric connector in said opening;

a non-conductive extension element, extending from said housing away from said backplane;

a conductive element, extending from said extension element, arranged to discharge static electricity from said extension element as said module is slid into said casing;

a mounting assembly for securing said module to said casing; and a gasket for shielding electromagnetic signals about said connector and between said backplane and said mating surface.

26. The combination of claim 25, wherein said module further comprises a plurality of parallel fins extending outwardly from opposed faces of said extension element.

27. The combination of claim 26, wherein said fins extend along a height of said module.

28. The combination of claim 27, wherein said casing defines a slot, and wherein said module is mounted within said slot.

29. The combination of claim 28, wherein said mounting assembly comprises a bulkhead adapted to engage said casing proximate an opening to said slot.

30. The combination of claim 29, wherein said slot has a length and said shielded housing extends less than half said length.

* * * * *